(12) United States Patent
Jang

(10) Patent No.: US 6,392,275 B1
(45) Date of Patent: May 21, 2002

(54) SEMICONDUCTOR DEVICE WITH DMOS, BJT AND CMOS STRUCTURES

(75) Inventor: Young-soo Jang, Kimpo (KR)

(73) Assignee: Fairchild Korea Semiconductor, Ltd. (KR)

( * ) Notice: Subject to any disclaimer, the term of this patent is extended or adjusted under 35 U.S.C. 154(b) by 0 days.

(21) Appl. No.: 09/421,681

(22) Filed: Oct. 20, 1999

(30) Foreign Application Priority Data

Nov. 20, 1998 (KR) .............................. 98-49957

(51) Int. Cl.[7] .................. H01L 29/76; H01L 29/94; H01L 31/062; H01L 31/113; H01L 31/119
(52) U.S. Cl. ................... 257/343; 257/335; 257/336; 257/337; 257/338
(58) Field of Search ................ 257/336, 337, 257/338, 335, 378, 343

(56) References Cited

U.S. PATENT DOCUMENTS

| | | | |
|---|---|---|---|
| 4,879,584 A | * 11/1989 | Takagi et al. | 357/43 |
| 5,045,900 A | * 9/1991 | Tamagawa | 357/23.4 |
| 5,072,268 A | 12/1991 | Rumennik | |
| 5,119,162 A | * 6/1992 | Todd et al. | 357/43 |
| 5,317,180 A | * 5/1994 | Hutter et al. | 257/337 |
| 5,340,756 A | * 8/1994 | Nagayasu | 437/34 |
| 5,411,901 A | 5/1995 | Grabowski et al. | |

OTHER PUBLICATIONS

High Voltabe DMOS and PMOS in Analog IC's IEDM, 1982, pp 81–84, A.W. Ludikhuize.

* cited by examiner

*Primary Examiner*—Eddie Lee
*Assistant Examiner*—Jesse A Fenty
(74) *Attorney, Agent, or Firm*—Rothwell, Figg, Ernst & Manbeck

(57) ABSTRACT

A semiconductor device having a substrate composed of a DMOS transistor, a complementary MOS (CMOS) transistor and a bipolar junction transistor is disclosed. A highly-doped bottom layer is formed on a lower edge of a body region of the DMOS transistor, a heavily doped bottom layer of a conductivity type opposite to that of the substrate is formed on a lower edge of source and drain regions of the CMOS transistor, and a highly-doped bottom layer of the same conductivity type as that of the substrate is formed on a lower portion of an intrinsic base region of the bipolar junction transistor, to thereby enhance the electrical characteristics of devices.

5 Claims, 18 Drawing Sheets

US 6,392,275 B1

SEMICONDUCTOR DEVICE WITH DMOS, BJT AND CMOS STRUCTURES

BACKGROUND OF THE INVENTION

1. Field of the Invention

The present invention relates to a semiconductor device and a manufacturing method thereof, and more particularly, to a semiconductor device including a bipolar junction transistor (BJT), a complementary MOS (CMOS) transistor and a double diffused MOS (DMOS) transistor, and to a manufacturing method thereof.

2. Description of the Related Art

In a typical complex system for complexly performing signal processing, operations, logic and other functions, each of the functions is performed by semiconductor devices manufactured by various manufacturing processes. For instance, bipolar junction transistors (BJTs) having high transfer conductance, are usually used for an analog circuits. However, complementary MOS (CMOS) transistors having high integration and low frequency are usually used for logic or memory circuits. In particular, double diffused MOS (DMOS) transistors are usually used for circuits requiring operation at high voltages and at high switching speeds.

However, there have been disclosed various processes for manufacturing integrated circuit chips in which both CMOS devices and bipolar devices are formed, and various processes for manufacturing integrated circuit chips in which DMOS devices appropriate for operation at high voltages are formed. Here, the integration of the device is increased; however, the manufacturing process is complex due to the multiple mask layers required for the manufacturing process, and there are limits on the performance of each of the devices. A DMOS device will be described with reference to the attached drawings.

FIG. 1 is a schematic sectional view of a conventional lateral DMOS transistor, and FIG. 2 is an enlarged view of portion A of FIG. 1.

Referring to FIGS. 1 and 2, an n-type well region 2 is formed in a p-type semiconductor substrate 1 such that the well region 2 is adjacent to a surface of the semiconductor substrate 1. A p-type top region 3 having a predetermined length and an n-type drain region 4 are formed in the well region 2. The length of the p-type top region 3 is determined by the voltage $V_{ds}$ between a drain and a source, and is spaced apart from the drain region 4. A p-type body region 5 is formed in another predetermined region of the semiconductor substrate 1, spaced apart from the well region 2 by a predetermined distance. An n-type heavily doped source region 6 and a p-type heavily doped source region 7, which are adjacent to each other, are formed in the p-type body region 5.

A source electrode 8 is formed to be electrically connected to the source region 6, and a drain electrode 9 is formed to be electrically connected to the drain region 4. Also, a gate electrode 10 is formed to be electrically insulated from the semiconductor substrate 1 by a gate insulating layer 11. The source electrode 8, the drain electrode 9 and the gate electrode 10, are electrically insulated by an interdielectric layer.

The above lateral DMOS transistor is turned on or off according to a signal applied to the gate electrode 10 in the state in which a high voltage is applied to the drain electrode 9. Particularly, when the lateral DMOS transistor is used as a power switching device at a high voltage, e.g., 600~800V and the device is in the on-state, electrons move to the drain region 4 from the source region 6, and energy is stored in an inductor connected to an external circuit. When the device is in the off-state, charges stored in the inductor are discharged, and the discharged current flows to the source electrode 8 through a resistance $R_b$ (of FIG. 2) in the body region 5. When the voltage is dropped by the resistance $R_b$, and the junction of the body region 5 and the source region 6 is forward-biased by the voltage drop, a parasitic npn BJT 20 (of FIG. 2) formed by the n-type well region 2, the p-type body region 5 and the n-type source region 6 operates. When the parasitic npn BJT 20 operates, the device cannot be controlled by the gate electrode 10 any more, and further, the device may be broken.

There have been proposed various methods for suppressing turn-on of the parasitic npn BJT 20, where a method for reducing the size of resistance $R_b$ in the body region 5 has been studied.

Meanwhile, the breakdown voltage must be increased to use the lateral DMOS transistor at a high voltage. A depletion layer must be extended in the direction of the semiconductor substrate 1 in the well region 2 to realize a high breakdown voltage of 600V or more, and thus a lightly doped p-type semiconductor substrate must be used such that the resistivity becomes approximately 100 Ωcm. However, if an NMOS transistor is formed on the lightly doped semiconductor substrate, punchthrough easily occurs in a channel having a length of approximately 3 μm or less, to thereby reduce the breakdown voltage between the drain and the source. Also, if the npn BJT is formed on the semiconductor substrate, an intrinsic base region of the npn BJT is formed with a concentration the same as that of the body region of the DMOS transistor, to thereby deteriorate characteristics of the npn BJT and DC current gain $h_{FE}$ due to the lightly doped base region.

SUMMARY OF THE INVENTION

It is an objective of the present invention to provide a semiconductor device having a substrate in which a BJT, a CMOS transistor and a DMOS transistor are formed.

It is another objective of the present invention to provide a method for manufacturing the semiconductor device.

Accordingly, to achieve the first objective, a semiconductor device according to an embodiment of the present invention includes a bipolar junction transistor and a DMOS transistor formed on a semiconductor substrate of a first conductivity type. The DMOS transistor comprises a body region of the first conductivity type and a well region of a second conductivity type formed in a predetermined upper region of the semiconductor substrate, wherein the body region and the well region are spaced by a predetermined interval, a highly-doped bottom layer of the first conductivity type to contact the lower surface of the body region in the semiconductor substrate, a highly-doped source region of the second conductivity type formed in a predetermined upper region of the body region, a highly-doped drain region of a second conductivity type formed in a predetermined upper region of the well region, a gate electrode formed on a channel formation region of the body region wherein an insulating layer is interposed between the gate electrode and the body region, a source electrode electrically connected to the source region, and a drain electrode electrically connected to the drain region.

Here, preferably, the semiconductor device further comprises a top region of the first conductivity type formed in an upper portion of the well region.

Preferably, the bipolar junction transistor comprises a well region of the first conductivity type formed in a predetermined upper portion of the semiconductor substrate, a highly-doped bottom layer of the first conductivity type formed in a predetermined region of the well region, a first base region of the first conductivity type contacting the upper surface of the bottom layer in the well region, a highly-doped second base region of the first conductivity type contacting the upper portion of the bottom layer in the first base region, a highly-doped emitter region of the second conductivity type formed in a part of the surface of the first base region, and a base electrode, an emitter electrode and a collector electrode electrically connected to the second base region, the emitter region and the collector region, respectively;

To achieve the first object, a semiconductor device according to another embodiment of the present invention includes a MOS transistor and a DMOS transistor formed on a substrate of a first conductivity type. Here, the DMOS transistor comprises a body region of the first conductivity type and a well region of a second conductivity type formed in a predetermined upper region of the semiconductor substrate, spaced by a predetermined interval, a highly-doped bottom layer of the first conductivity type to contact a lower surface of the body region in the semiconductor substrate, a highly-doped source region of the second conductivity type formed in a predetermined upper region of the body region, a highly-doped drain region of the second conductivity type formed in a predetermined upper portion of the well region, a gate electrode formed on a channel formation region of the body region wherein an insulating layer is interposed between the gate electrode and the body region, a source electrode to be electrically connected to the source region, and a drain electrode to be electrically connected to the drain region.

Here, preferably, the MOS transistor comprises a highly-doped bottom layer of a first conductivity type formed in a predetermined upper region of the semiconductor substrate, highly-doped source and drain regions of a second conductivity type contacting the upper portion of the bottom layer and spaced apart by a predetermined interval, a gate electrode insulated to a channel formation region between the source region and the drain region by an insulating layer, and source and drain electrodes electrically connected to the source region and the drain region.

To achieve the second object, a method of manufacturing a semiconductor device according to an embodiment of the present invention produces the semiconductor device having a DMOS transistor formed in a first region of a semiconductor substrate of a first conductivity type and a bipolar junction transistor formed in a second region of the semiconductor substrate. By the method, first and second well regions of the second conductivity type are formed in the selected first region and the second region, respectively. Then, highly-doped first and second bottom layers of the first conductivity type are formed in the selected first region and the selected second well region, respectively. An epitaxial layer of the first conductivity type is formed on the first and the second well regions and the semiconductor substrate where the first and the second bottom layers are formed. A drift region of the second conductivity type is formed, having two portions spaced apart by a predetermined interval, and the drift region contacts the upper surface of the first well region in an epitaxial layer of the first region, and a second well extension region is formed in the epitaxial layer of the second region, contacting the upper surface of the second well region. First and second body regions of the first conductivity type are formed in the epitaxial layer of the first region and selected epitaxial layer of the second region to contact the lower surface of the first body region with the upper surface of the first bottom layer and the lower surface of the second body region with the upper surface of the second bottom layer. A gate oxide layer and a gate electrode are sequentially formed on the first region. Highly-doped source and drain regions are formed in the first body region and the selected drift region, a highly-doped base region of the second conductivity type and an emitter region of the first conductivity type in the selected second body region, and a highly-doped collector region of the second conductivity type in the selected second well extension region. Source and drain electrodes are formed on the first region, wherein the source and drain electrodes are electrically connected to the source and the drain regions, respectively. A base electrode, an emitter electrode and a collector electrode are formed on the second region, wherein the a base electrode, an emitter electrode and a collector electrode are electrically are connected to the base region, the emitter region and the collector region, respectively.

Here, preferably, the step of forming the first and the second bottom layers comprises the steps of forming an oxide layer on the semiconductor substrate, forming a photoresist layer pattern exposing a predetermined region of the oxide layer on the semiconductor substrate, implanting impurity ions of the first conductivity type using the photoresist layer pattern as an ion implantation mask, and drive-in diffusing the impurity ions of the first conductivity type. At this time, the thickness of the first and the second bottom layers is 1~2 $\mu$m, and the thickness of the drift region is thinner than the thickness of the epitaxial layer and is half of the thickness of the epitaxial layer.

Preferably, the step of forming the first and the second body regions comprises the steps of forming an oxide layer on the epitaxial layer, forming a photoresist layer pattern exposing predetermined regions of the first and the second regions, on the oxide layer, implanting impurity ions of the first conductivity type using the photoresist layer pattern as an ion implantation mask, and drive-in diffusing impurity ions of the first conductivity type.

To achieve the second object, in a method for manufacturing semiconductor devices according to another embodiment of the present invention, the semiconductor device includes a DMOS transistor formed in a first region of a semiconductor substrate of a first conductivity type and a MOS transistor formed in a second region of the semiconductor substrate. By the method, a well region of the first conductivity type is formed in the selected first region. Then, highly-doped first and second bottom layers of the first conductivity type are formed in a predetermined upper portion of the first region and in the upper portion of the second region. An epitaxial layer of the first conductivity type is formed on the semiconductor substrate where the well region and the first and the second bottom layers are formed. A drift region of the second conductivity type is formed, having two portions spaced apart by a predetermined interval, and the drift region contacts the upper surface of the well region in an epitaxial layer of the first region, and a body region of the first conductivity type is formed, spaced apart from the drift region by a predetermined interval. A gate oxide layer and a gate electrode are sequentially formed on the first and the second regions. Highly-doped source and drain regions of the second conductivity type of the DMOS transistor are formed in the selected body region and the predetermined drift region, and highly-doped source and drain regions of the second conductivity type of the MOS transistor are formed, and the source and drain regions are spaced apart by a predetermined interval in the predetermined epitaxial layer of the second region. Also, source and drain electrodes electrically connected to the source and drain regions of the DMOS transistor and the MOS transistor respectively are formed.

Here, preferably, the epitaxial layer is formed to have a resistivity substantially similar to that of the semiconductor substrate.

Preferably, a predetermined upper portion of the second bottom layer is extended to the epitaxial layer by predetermined annealing in the step of forming the epitaxial layer.

According to the semiconductor device and the method for manufacturing the same, a heavily doped bottom layer is formed under the source region of the DMOS transistor, to thereby suppress turn-on of a sacrificial bipolar transistor, and the source and drain region of a complementary MOS (CMOS) transistor and a base region of a bipolar junction transistor are formed to contact the heavily doped bottom layer, so that the breakdown voltage of the CMOS transistor and the bipolar junction transistor of the device increase reliability.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

Figure 1:
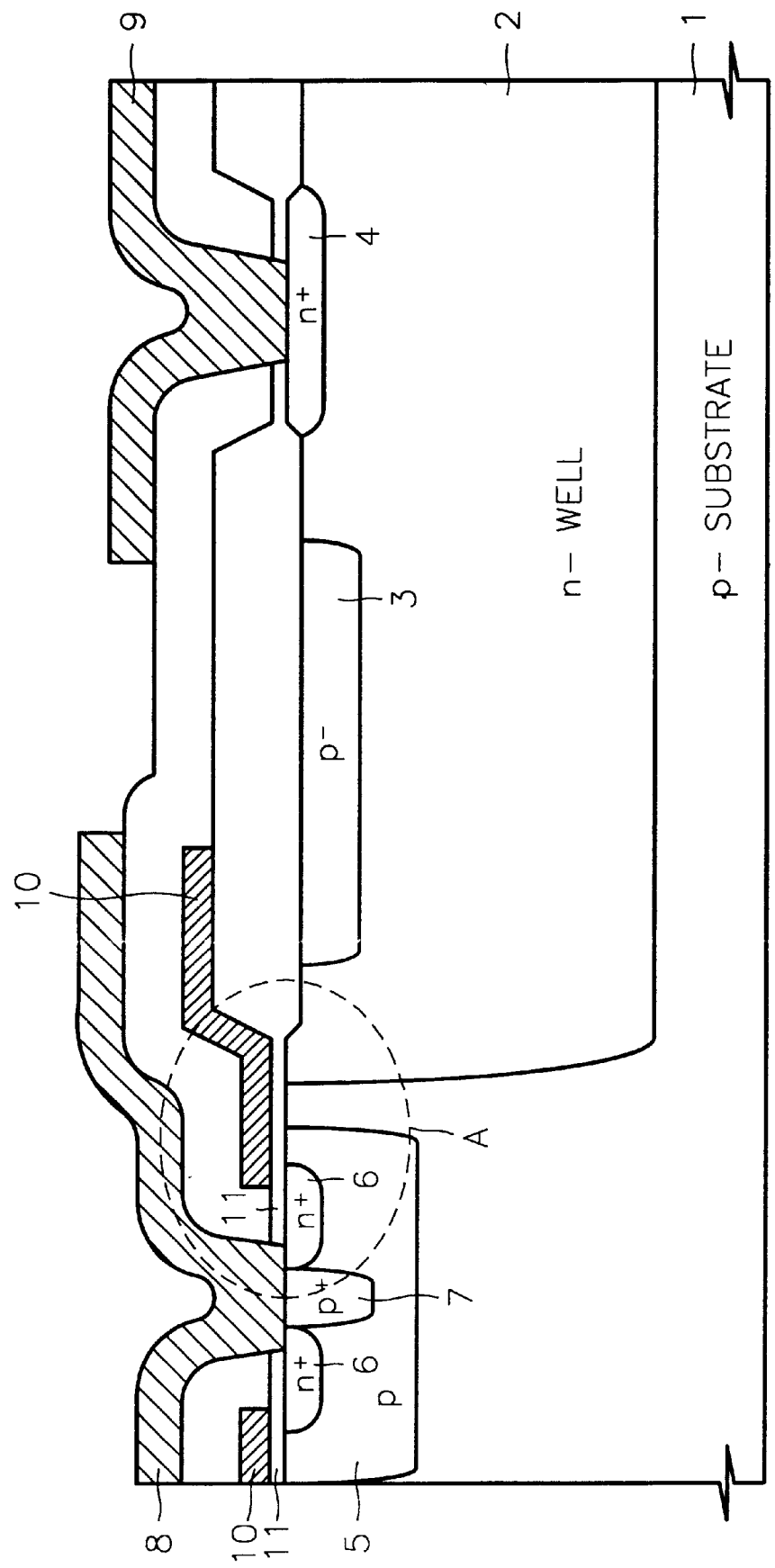
FIG. 1 is a sectional view of a conventional lateral DMOS electric field effect transistor.
Figure 2:
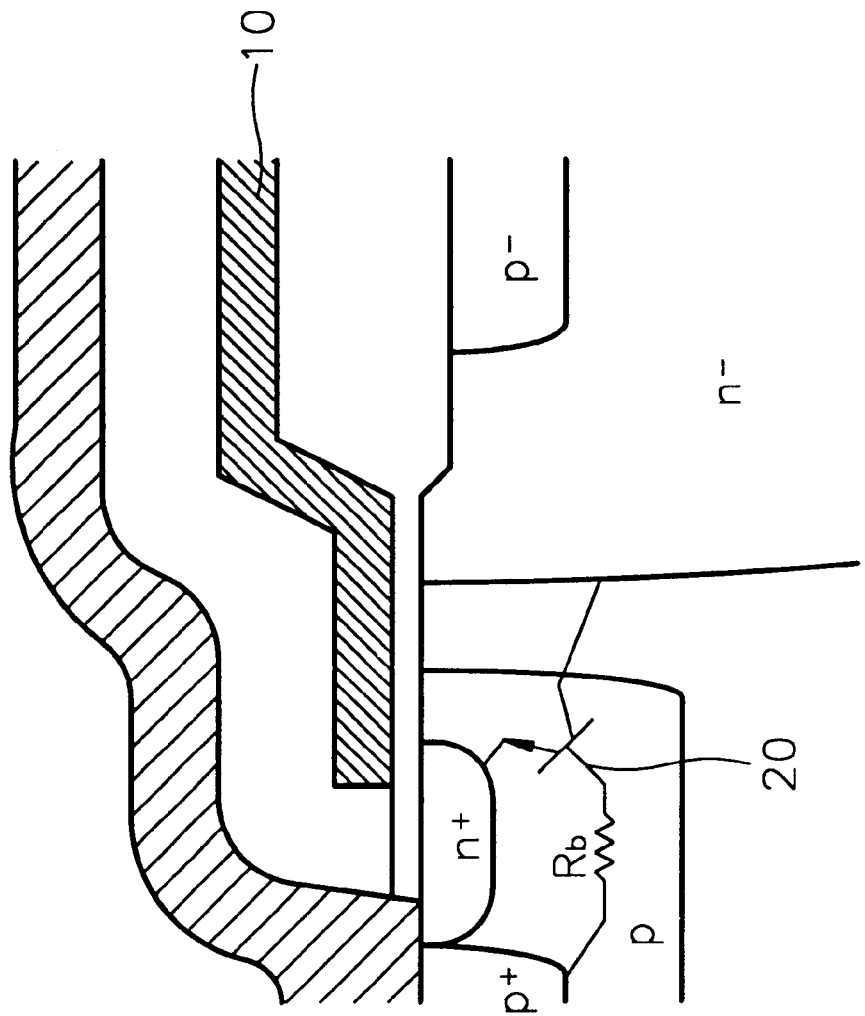
FIG. 2 is an enlarged view of portion A of FIG. 1.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present.

Figure 3:
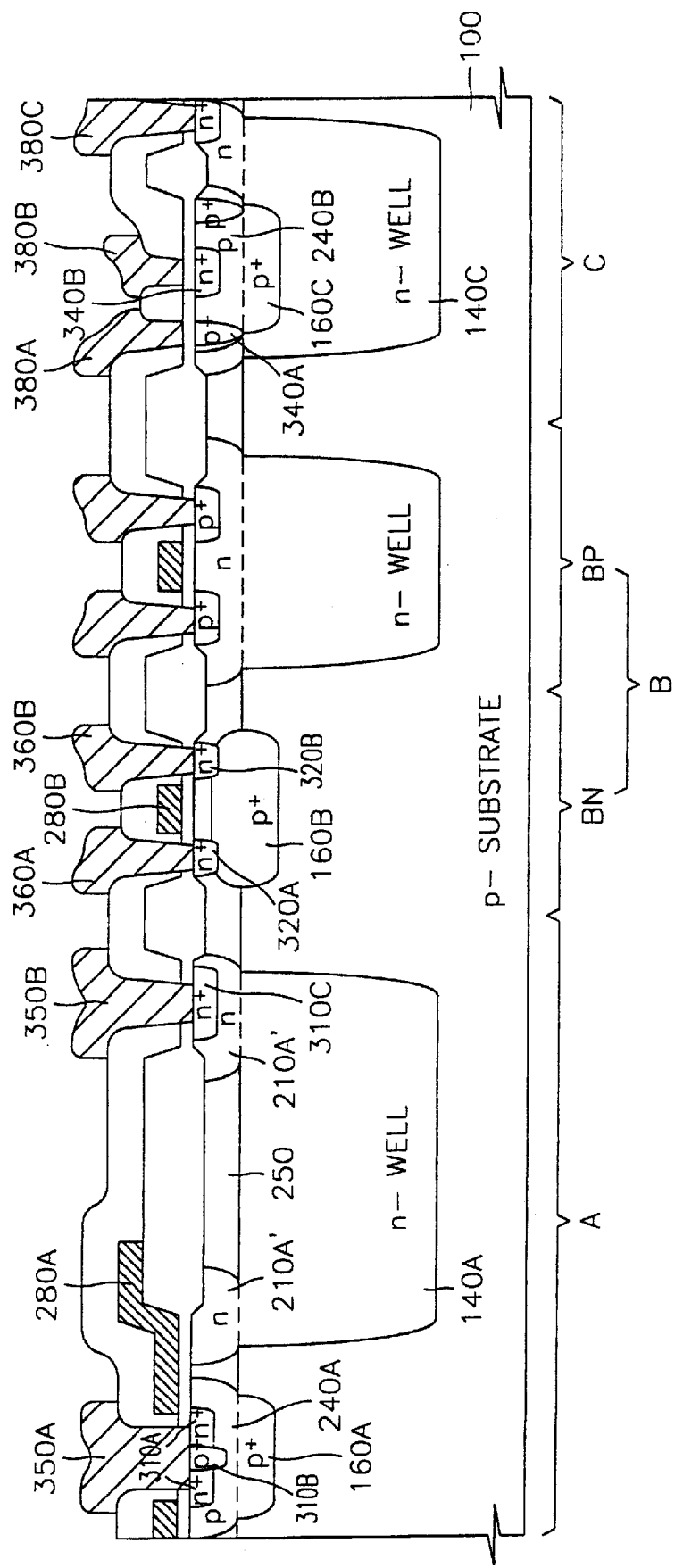
FIG. 3 is a sectional view of a semiconductor according to the present invention.

FIG. 3 shows a BiCDMOS device having a semiconductor substrate in which a BJT, a CMOS transistor and a DMOS transistor are formed.

Referring to FIG. 3, a DMOS transistor A, a CMOS transistor B and a BJT C are formed in a p-type lightly-doped semiconductor substrate 100.

Here, in the structure of the DMOS transistor A, a p-type body region 240A and an n-type well region 140A are formed in a predetermined upper region of a semiconductor substrate 100, spaced apart from each other by a predetermined interval. Also, the DMOS transistor A includes a p-type highly-doped bottom layer 160A contacting a bottom portion of the body region 240A. An n-type highly-doped source region 310A and a p-type highly-doped source region 310B, which are adjacent to each other, are formed in a predetermined upper region of the body region 240A. A p-type top region 250 and an n-type highly-doped drain region 310C are formed in the upper portion of the well region 140A. A gate electrode 280A is formed on a channel formation region of the body region 240A through the gate insulating layer, a source electrode 350A is electrically connected to the source region 310A, and a drain electrode 350B is electrically connected to the drain region 310C.

In the above DMOS transistor, the p-type body region 240A in the source area contacts the p-type bottom layer 160A, so that the resistance of the p-type body region 240A of the source region is reduced, which reduces the voltage drop caused by the reverse current. Thus, when the voltage drop caused by the reverse current is reduced, turn-on of the parasitic bipolar transistor is suppressed.

In the structure of the CMOS transistor, the structure of the PMOS transistor (BP) is the same as that of a conventional PMOS transistor, so that the NMOS transistor (BN) will be described as follows. In the NMOS transistor BN, an n-type highly-doped source region 320A and a drain region 320B are spaced apart by a predetermined interval in a predetermined upper region of the semiconductor substrate 100. A p-type highly-doped bottom layer 160B is formed at the bottom portions of the source region 320A and the drain region 320B. The p-type bottom layer 160B having a concentration higher than that of the semiconductor substrate 100 is formed under the region where a channel is to be formed, i.e., between the source region and the drain region, to thereby increase the breakdown voltage. The structures of the gate electrode 280B, the source electrode 360A and the drain electrode 360B are the same as those of a typical MOS device.

Meanwhile, in the structure of the BJT(C), a highly-doped p-type bottom layer 160C is formed in a predetermined upper region of the n-type well region 140C of the semiconductor substrate 100, and a p-type intrinsic base region 240B has a lower portion contacting the upper surface of the p-type highly-doped bottom layer 160C. Also, a p-type extrinsic base region 340A is formed to contact the upper portion of the p-type bottom layer 160C via the p-type intrinsic base region 240B. Thus, the breakdown voltage of a device is increased and a base modulation phenomenon can be improved. The structures of a base electrode 380A, an emitter electrode 380B and a collector electrode 380C are the same as those of a usual BJT.

A method for forming a DMOS transistor, a CMOS transistor and a BJT on a semiconductor substrate is described with reference to FIGS. 4 through 19, which can be adopted to the case in which the DMOS transistor and the BJT are formed on the semiconductor substrate, and the case in which a DMOS transistor and a CMOS transistor are formed on the semiconductor substrate.

Figure 4:
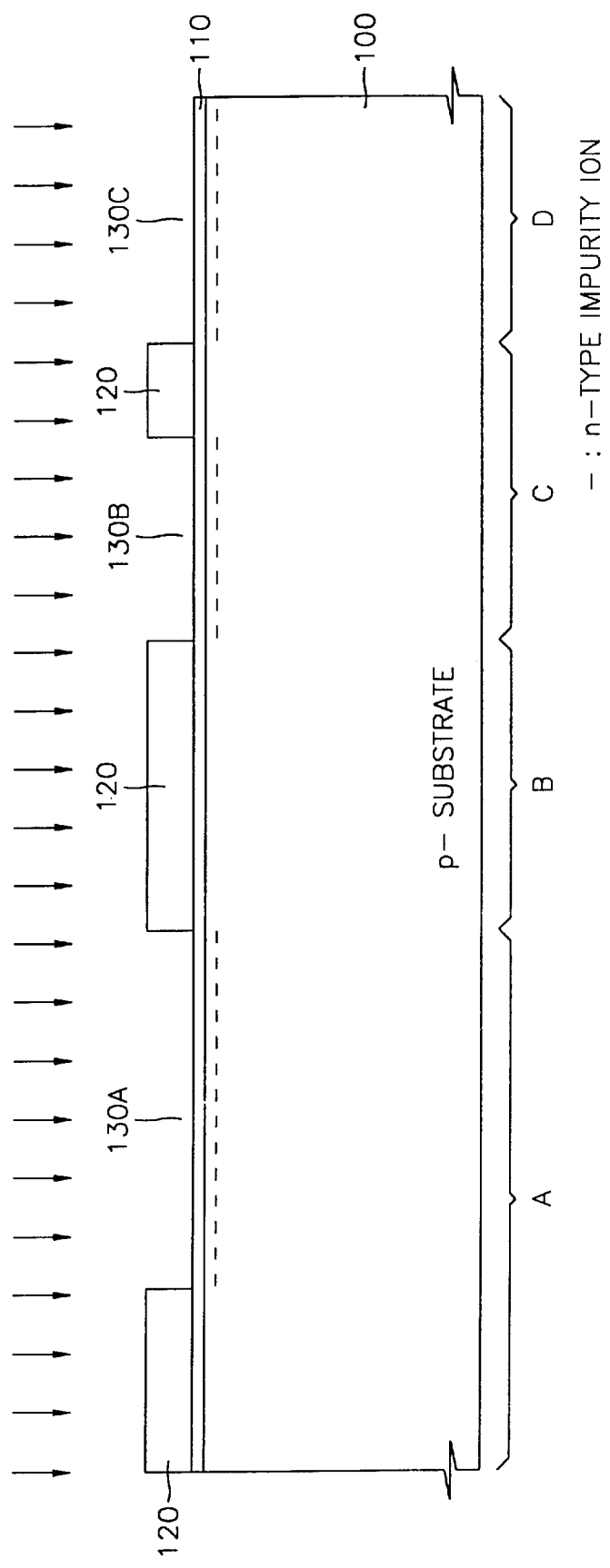
FIGS. 4 through 19 are sectional views for illustrating a method for manufacturing a semiconductor device according to the present invention.

Referring to FIG. 4, a p-type semiconductor substrate 100 has resistivity of approximately 100 Ωcm. The semiconductor substrate 100 includes region A where a lateral DMOS transistor is to be formed, region B where an NMOS transistor is to be formed, region C where a PMOS transistor is to be formed and region D where an npn BJT is to be formed. An oxide layer 110 is formed by oxidizing the surface of the semiconductor substrate 100. Also, a mask layer pattern 120 defining a predetermined region is formed by exposure and development using typical photolithography. That is, a photoresist layer is coated on the entire surface of the oxide layer 110. Subsequently, the photoresist layer is irradiated through a mask. In a negative photoresist layer, a photoresist layer of a portion which is not irradiated is removed. In a positive photoresist layer, a photoresist layer of a portion which is irradiated is removed. The remaining photoresist layer pattern, which is an implantation mask layer pattern 120 for forming an n-type well region, has an opening portion 130A exposing a portion where an n-type well region of the lateral DMOS transistor is to be formed, an opening portion 130B exposing a portion where an n-type well region of a PMOS transistor is to be formed and an opening portion 130C exposing a portion where an n-type well region of an npn BJT is to be formed.

Figure 5:
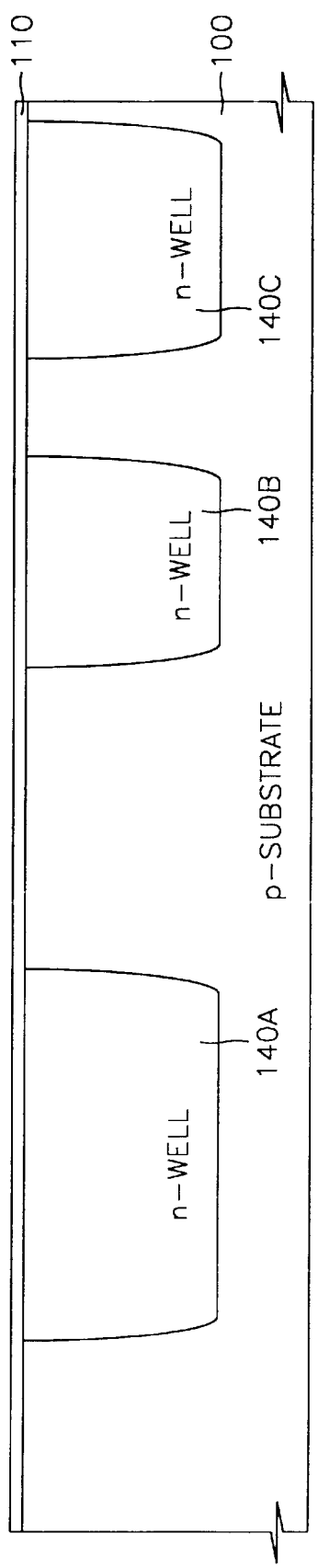

N-type impurity ions are implanted after the mask layer pattern 120 is formed. The implanted n-type impurity ions are generally phosphorus (P)ions, and the amount of impurity ions is $2 \times 10^{12} \sim 6 \times 10^{12}/cm^2$. Subsequently, after the mask layer pattern 120 is completely removed, the implanted impurity is drive-in diffused by annealing at a predetermined temperature, e.g., 1,200~1,250° C. Thus, as shown in FIG. 5, an n-type well region 140A of a lateral DMOS transistor, an n-type well region 140B of a PMOS transistor and an n-type well region 140C of an npn BJT are formed. The thickness of the n-type well regions 130A, 130B and 130C is 6~10 µm.

Figure 6:
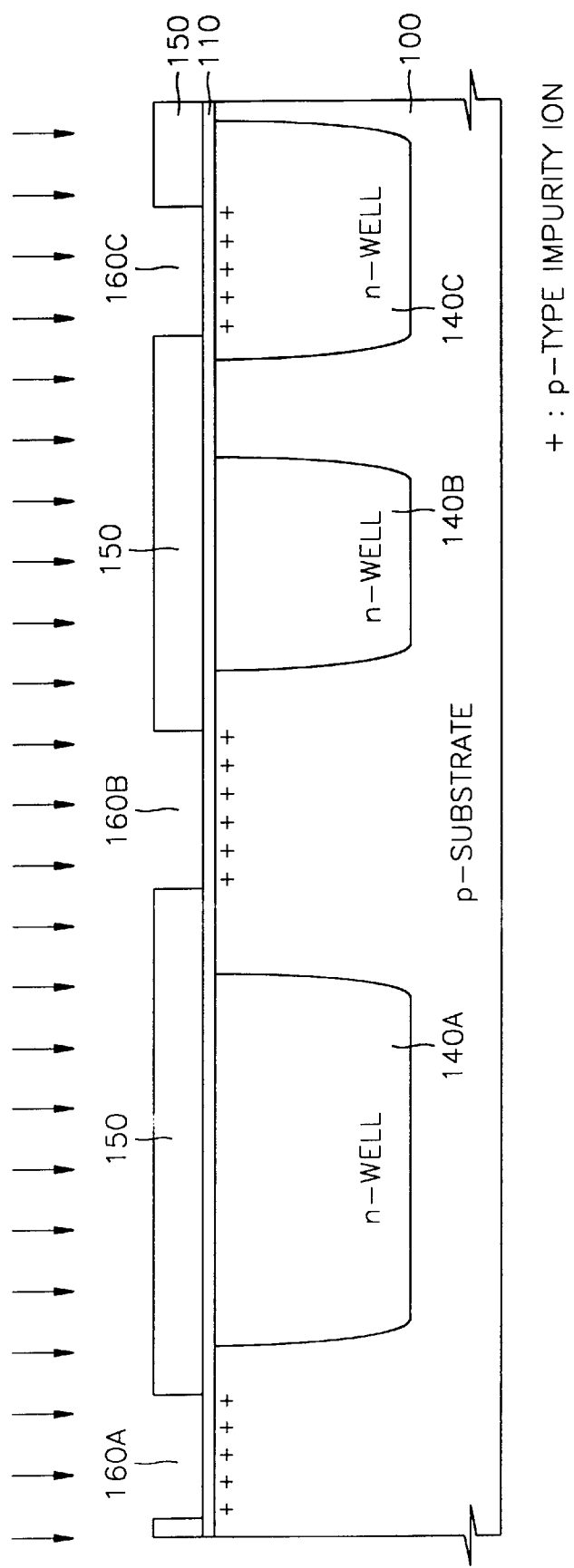
Figure 7:
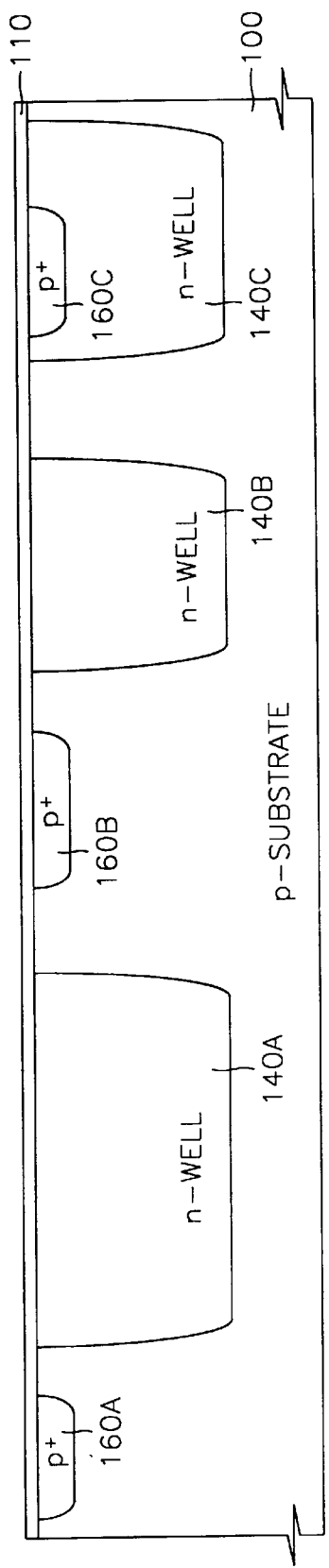

Referring to FIG. 6, a photoresist layer pattern 150 for forming a p-type bottom layer is formed on an oxide layer 110, through exposure and development using typical lithography as described above. The photoresist layer pattern 150 has an opening portion 160A exposing a portion where a source area of a lateral DMOS transistor is to be formed, an opening portion 160B exposing a portion where an active region of an NMOS transistor is to be formed, and an opening portion 160C exposing a predetermined upper portion of the n-type well region of the npn BJT. Subsequently, p-type impurity ions are implanted using the photoresist layer pattern 150 as an ion implantation mask. The p-type impurity ions are generally boron (B) ions, and the amount of impurity ions is $1 \times 10^{13} \sim 5 \times 10^{13}/cm^2$. Subsequently, the p-type impurity ions are drive-in diffused through annealing at a predetermined temperature, e.g., 1,100° C., after the photoresist layer pattern 150 is completely removed. Thus, a p-type bottom layer 160A of the lateral DMOS transistor, a p-type bottom layer 160B of the NMOS transistor and a p-type bottom layer 160C of the npn BJT are formed, as shown in FIG. 7. Here, the thickness of the p-type bottom layers 160A, 160B and 160C is 1~2 µm.

In the p-type bottom layer 160A formed in the source area of the lateral DMOS transistor, the resistance of the body region of the lower portion of the source region is reduced to thereby suppress operation of the parasitic npn BJT. In the p-type bottom layer 160B formed on the entire region of the NMOS transistor, punchthrough of a breakdown voltage between the drain and the source is suppressed in a short channel length, to thereby increase the breakdown voltage of the device. Also, in the p-type bottom layer 160C formed in the npn BJT, a phenomenon of base modulation in which the base width changes according to a collect voltage, is enhanced.

Figure 8:
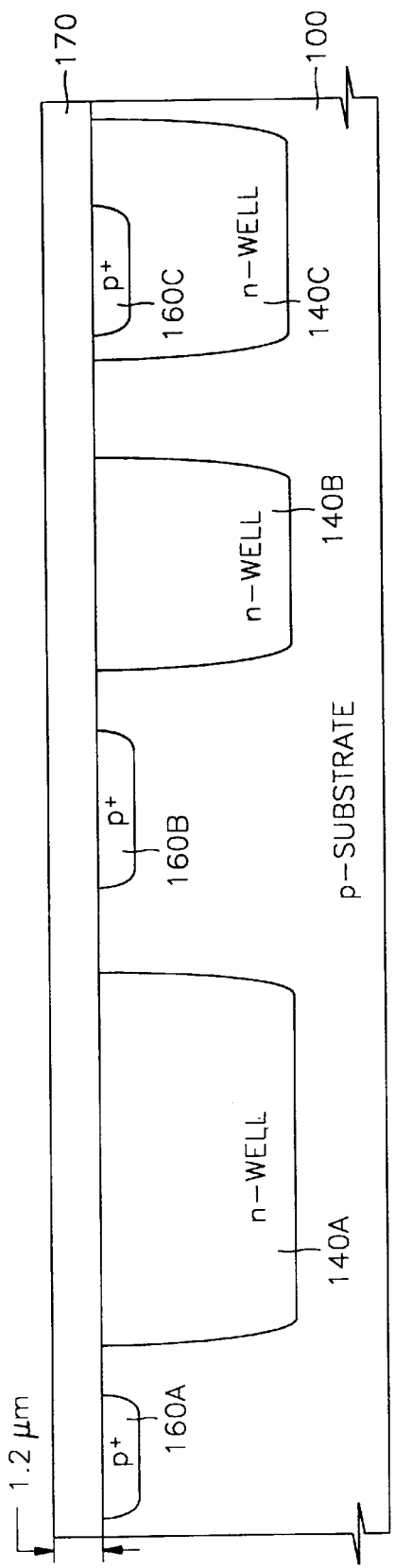

Referring to FIG. 8, the oxide layer 110 (of FIG. 6) is removed to completely expose the surface of the semiconductor substrate 100. An epitaxial layer 170 of a predetermined thickness is formed on the surface of the semiconductor substrate 100. The epitaxial layer 170 has the same conductivity type as that of the semiconductor substrate 100, and a thickness of 1~2 µm.

Figure 9:
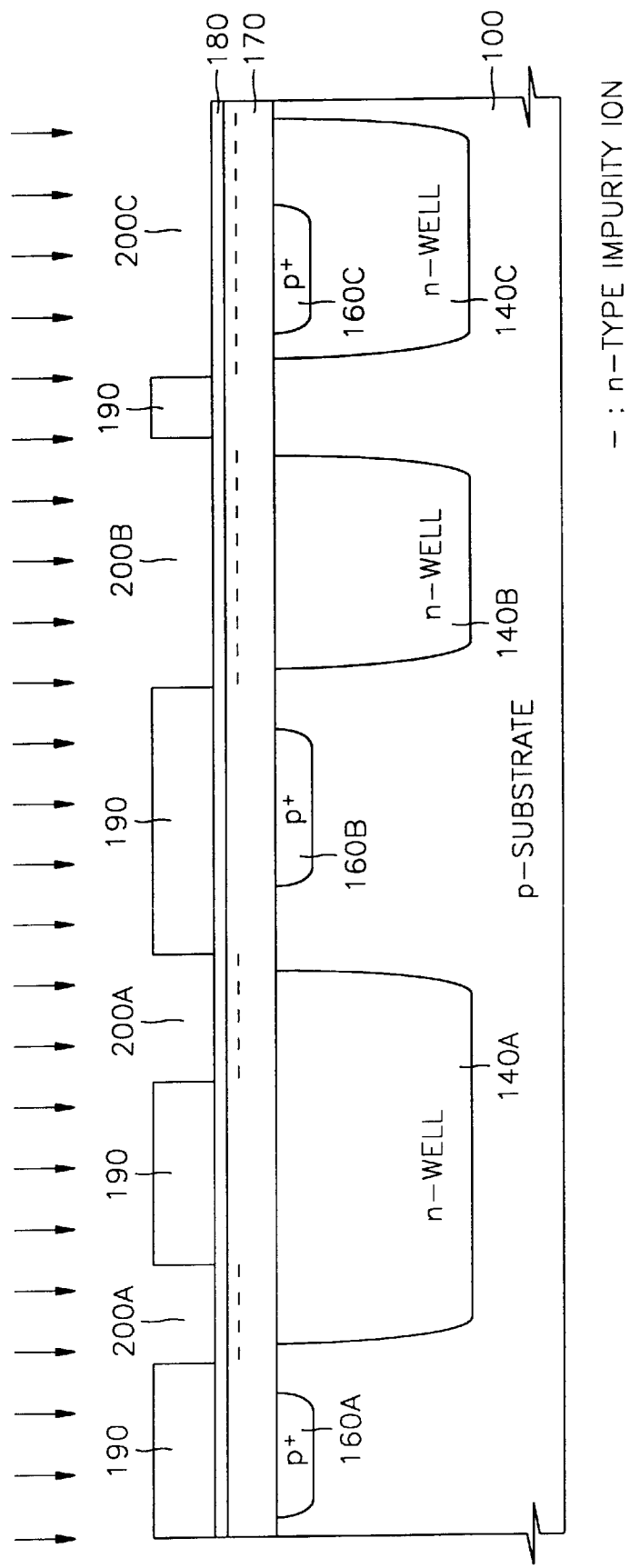
Figure 10:
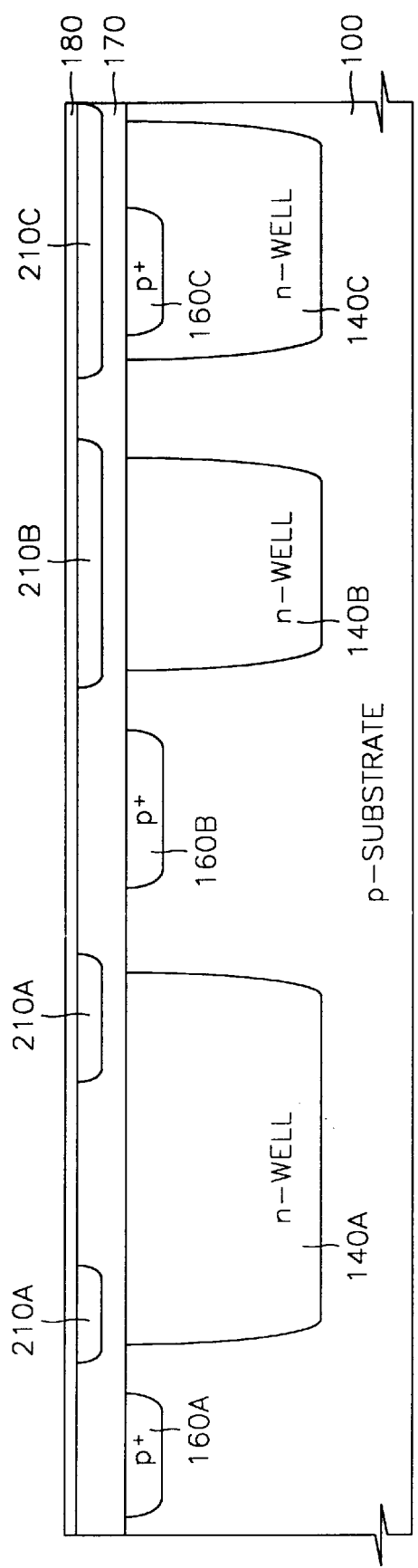

Referring to FIG. 9, an oxide layer 180 of approximately 500 Å is formed on the epitaxial layer 170. Then, a photoresist layer pattern 190 is formed on the oxide layer 180, through exposure and development using typical lithography as described above. The photoresist layer pattern 190 has opening portions 200A for exposing predetermined portions of the n-type well region of the lateral DMOS transistor, an opening portion 200B for exposing the n-type well region of the PMOS transistor and an opening portion 200C for exposing the n-type well region of the npn BJT. Subsequently, n-type impurity ions are implanted using the photoresist layer pattern 190 as an ion implantation mask. The n-type impurity ions are generally phosphorus (P)ions, and the concentration of implantation is $2 \times 10^{12} \sim 6 \times 10^{12}/cm^2$. Subsequently, the photoresist layer pattern 190 is completely removed, and then the n-type impurity ions are drive-in diffused through annealing at a predetermined temperature, e.g., approximately 1,200° C. Thus, extension regions 210A of the n-type well region of the lateral DMOS transistor are used as drift regions in each device, an extension region 210B of the n-type well region of the PMOS transistor and an extension region 210C of the n-type well region of the npn BJT are formed, as shown in FIG. 10. Here, preferably, the extension regions 210A, 210B and 210C of the n-type well regions of each device are formed to be ½ of the total thickness of the epitaxial layer 170. This is because diffusion is continued through the next process of annealing.

Figure 11:
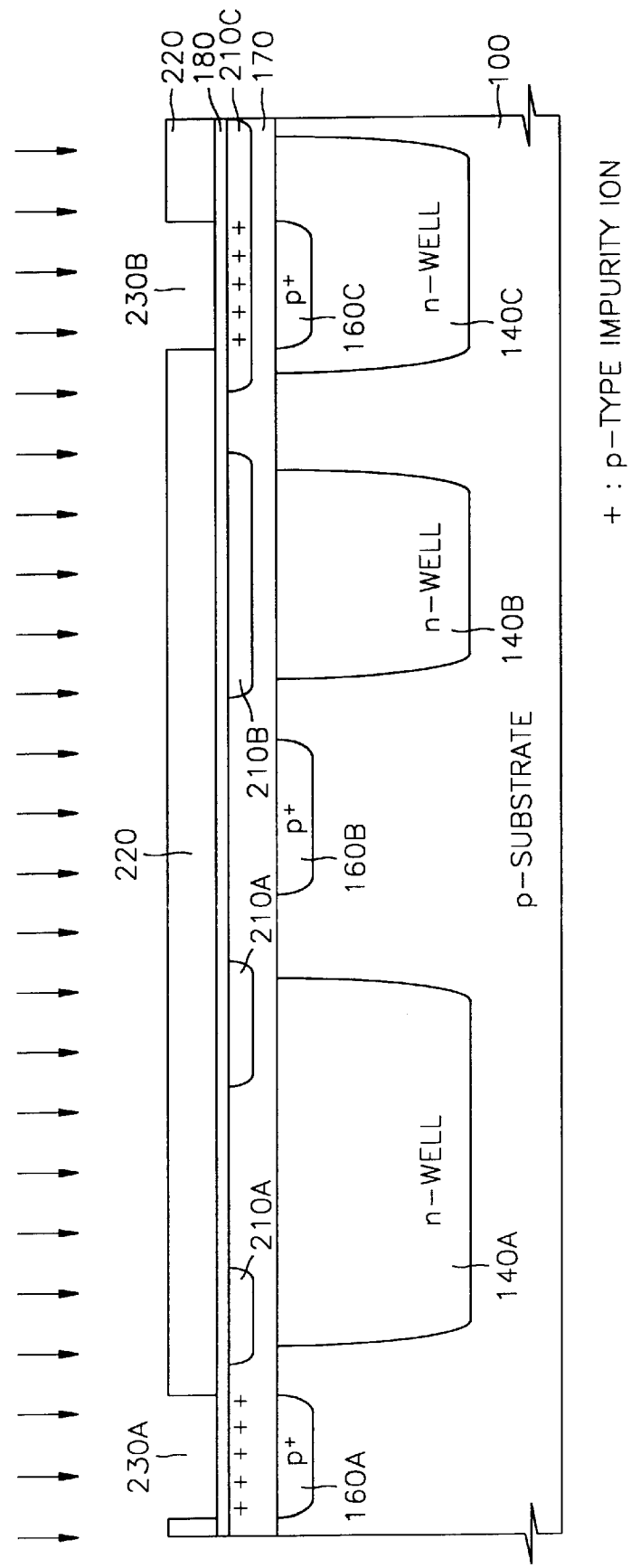

Referring to FIG. 11, a photoresist layer pattern 220 is formed on an oxide layer 180 through exposure and development using typical lithography. The photoresist layer pattern 220 has an opening portion 230A exposing a portion where a p-type body region of the lateral DMOS transistor is to be formed and an opening portion 230B exposing a portion where an intrinsic base region of the npn BJT is to be formed. Subsequently, p-type impurity ions are implanted using the photoresist layer pattern 220 as an ion implantation mask. The p-type impurity ions are generally boron ions, and the concentration of the boron is $4 \times 10^{12} \sim 8 \times 10^{12}/cm^2$.

Figure 12:
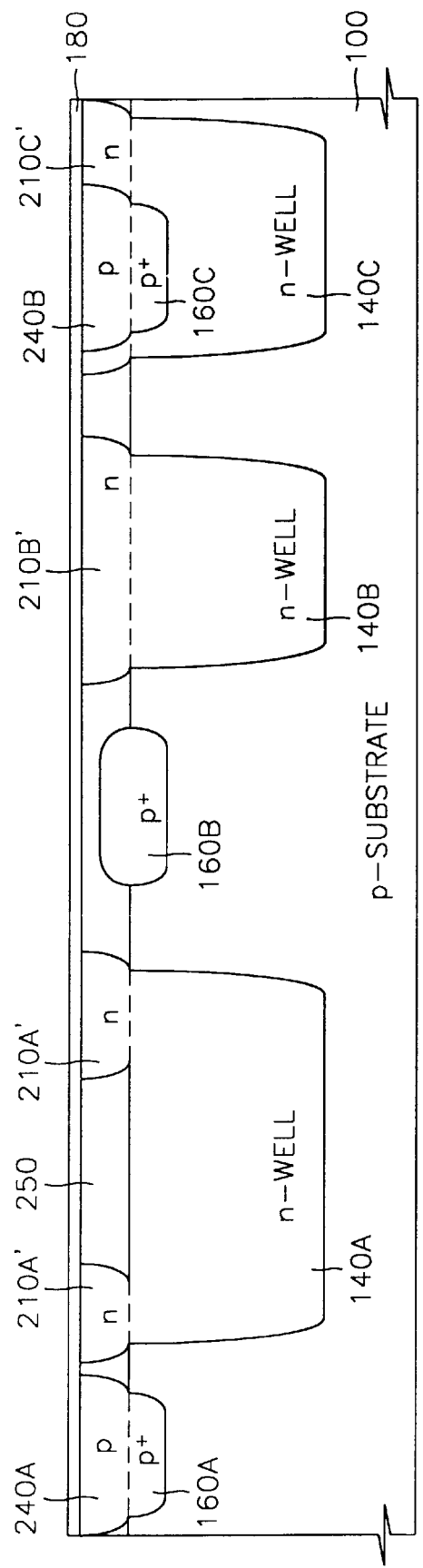

Referring to FIG. 12, the photoresist layer pattern 220 (of FIG. 11) is completely removed, and then the implanted p-type impurities are drive-in diffused through annealing. Here, preferably, the temperature for annealing is lower than that of the performed annealing, i.e., 1,050~1,100° C. This is for constantly maintaining surface concentrations of each of the formed regions. When the annealing is performed, a p-type body region 240A of a lateral DMOS transistor and a p-type body region 240B of the npn BJT are formed to a thickness the same as that of the epitaxial layer 170. That is, the p-type body region 240A of the lateral DMOS transistor contacts a p-type bottom layer 160A of a high concentration, and the p-type body region 240B of the npn BJT contacts the p-type bottom layer 160C of a high concentration.

As described above, n-type impurity ions in extension regions 210A, 210B and 210C of FIG. 11 of the n-type well region of the formed devices are drive-in diffused, so that extension regions 210A' of the n-type well region of the lateral DMOS transistor, an extension region 210B' of the n-type well region of a PMOS transistor and an extension region 210' C. of the n-type well region of the npn BJT are formed to a thickness the same as that of the epitaxial layer 170. That is, the lower portion of the extension region 210A' of the n-type well region of the lateral DMOS transistor contacts a predetermined upper portion of the n-type well region 140A, the extension region 210B' of the n-type well region of the PMOS transistor contacts the entire upper portion of the n-type well region 140B, and the extension region 210C' of the n-type well region of the npn BJT contacts the entire upper portion of the n-type well region 140C.

Meanwhile, the epitaxial layer 170 between the extension regions 210A' of the n-type well region of the lateral DMOS transistor can be used as a p-type top region 250. This is because the concentration of the epitaxial layer 170 is very similar to that of the semiconductor substrate 100. The p-type top region 250 is electrically connected to the semiconductor substrate 100 and has a depletion layer formed around the p-type top region 250 to disperse an electric field concentrated by a metal interconnection formed on the upper layer. Thus, the breakdown voltage of the device is increased.

Figure 13:
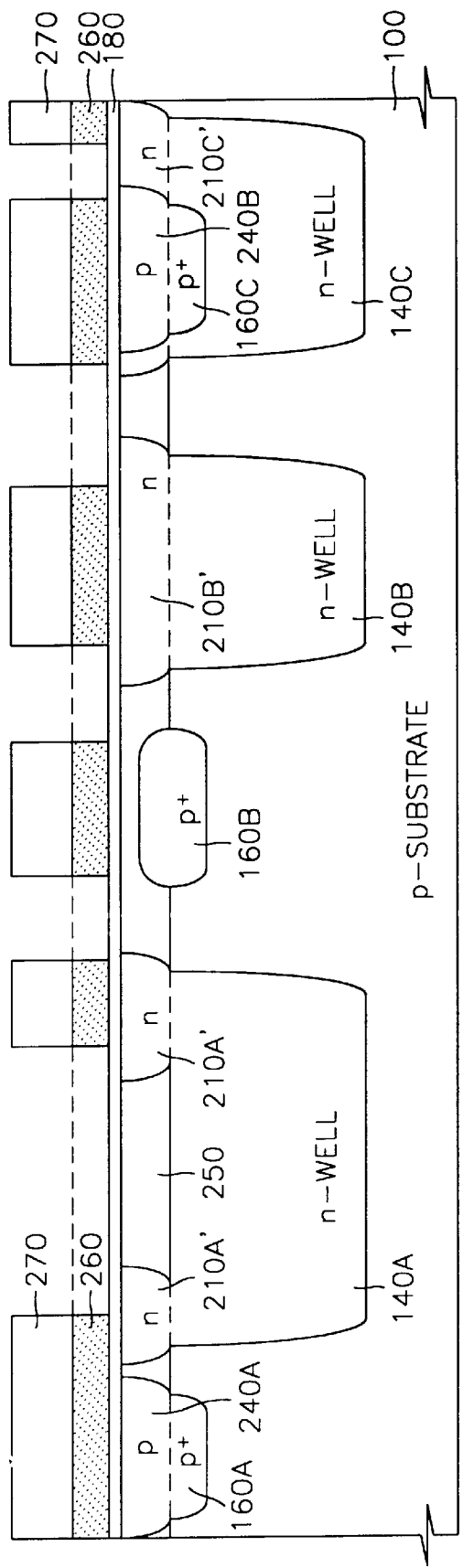

Referring to FIG. 13, a nitride layer pattern 260 for forming a field oxide layer is formed on the oxide layer 180. A nitride layer of 1,000~1,200 Å thickness is formed on the oxide layer 180. Then, a photoresist layer pattern 270 is formed on the nitride layer through exposure and development by typical photolithography. The photoresist layer pattern 270 partially exposes areas of the surface of the nitride layer corresponding to active regions of each of the devices. Subsequently, the nitride layer is etched using the photoresist layer pattern 270, to thereby form a nitride layer pattern 260 (the portion indicated by a dotted line denotes the etched nitride layer).

Figure 14:
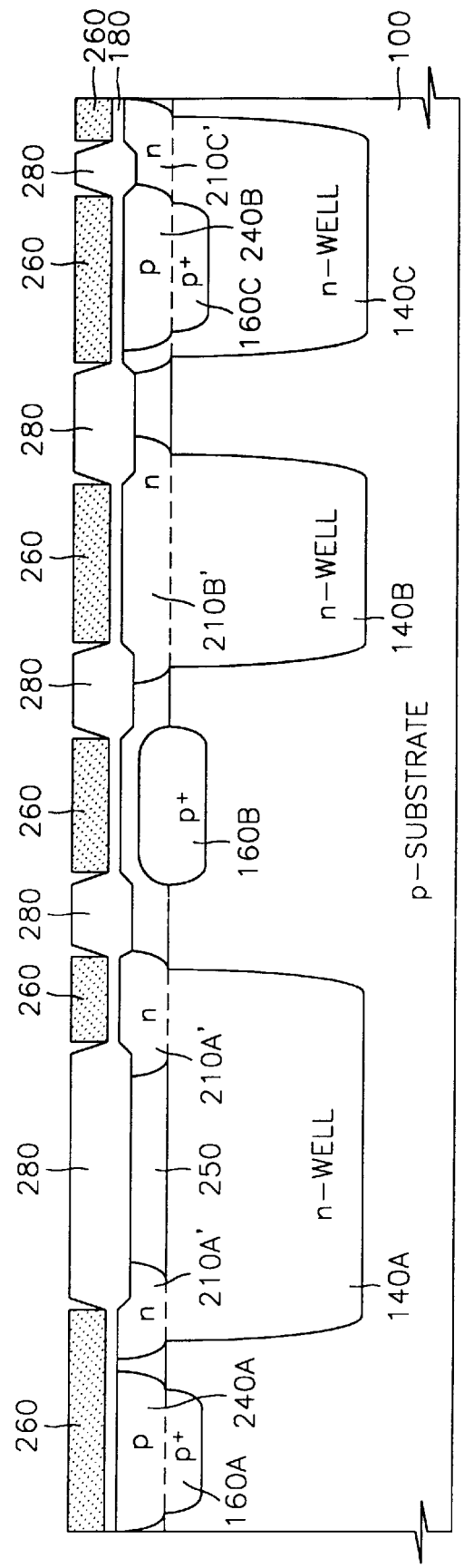

Referring to FIG. 14, the photoresist layer pattern 270 is removed. An annealing process is performed using a nitride layer pattern 260 as an oxide layer growth stopping layer, to thereby form a field oxide layer 280. Here, preferably, the annealing for growing the field oxide layer 280 is performed at a temperature of 950° C., and the thickness of the grown field oxide layer 280 is 6,500~8,000 Å.

Figure 15:
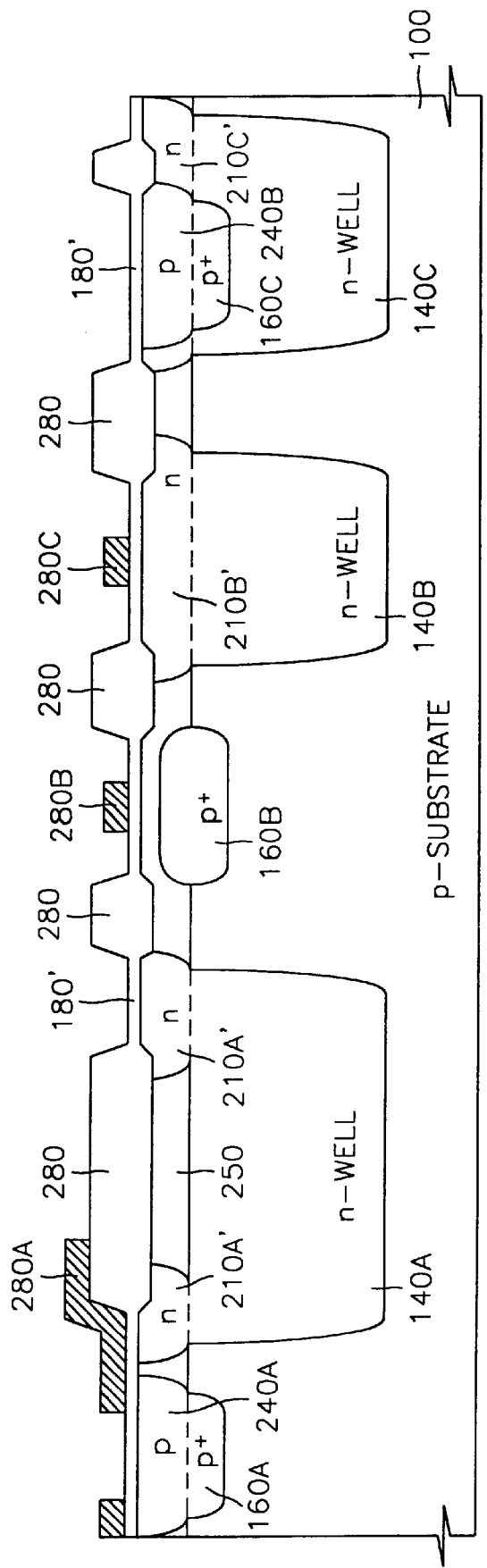

Referring to FIG. 15, a sacrificial oxide layer (not shown) is formed after removing the nitride layer pattern 260 (of FIG. 14). Defects caused by the nitride layer pattern 260 (of FIG. 14) are removed by removing the sacrificial oxide layer. Subsequently, an oxide layer 180' is thinly formed, e.g., to 500 Å, by annealing at approximately 950° C. The oxide layer 180' is partially used as a gate oxide layer. Then, a polysilicon layer is deposited on the oxide layer at a temperature of 620° C. to 4,000 Å. Also, the desired conductivity is obtained by doping the polysilicon layer. For instance, the polysilicon layer is highly doped using $POCl_3$, and then an oxide layer of phosphorus of the upper portion of the highly-doped polysilicon layer is removed. Then, the polysilicon layer is etched using a predetermined etching mask, to thereby form a conductive gate layer 280A of the lateral DMOS transistor, a gate conductive layer 280B of an NMOS transistor and a gate conductive layer 280C of the PMOS transistor.

Figure 16:
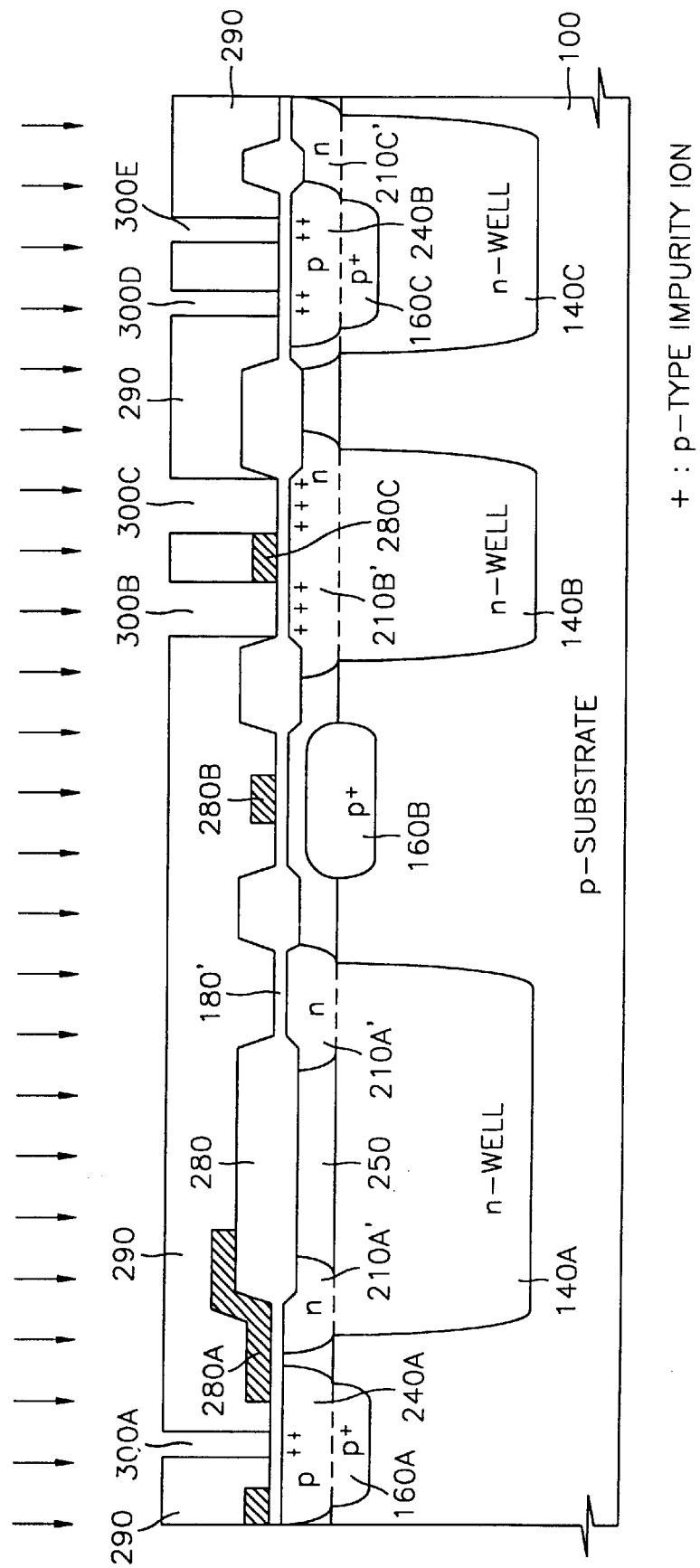

Referring to FIG. 16, a photoresist layer is coated on the entire surface of the structure of FIG. 15. A photoresist layer pattern 290 is formed by exposure and development using the above-described photolithography. The photoresist layer pattern 290 includes an opening portion 300A exposing the p-type highly-doped region in the P-type body region 240A of the lateral DMOS transistor, opening portions 300B and 300C exposing the source and drain regions of the PMOS transistor and opening portions 300D and 300E exposing the extrinsic base region of the npn BJT. Subsequently, p-type impurity ions are implanted using the photoresist layer pattern as an ion implantation mask, doped with $3\times10^{15}$~$5\times10^{15}/cm^2$. Here, the p-type impurity ions are generally boron ions.

Figure 17:
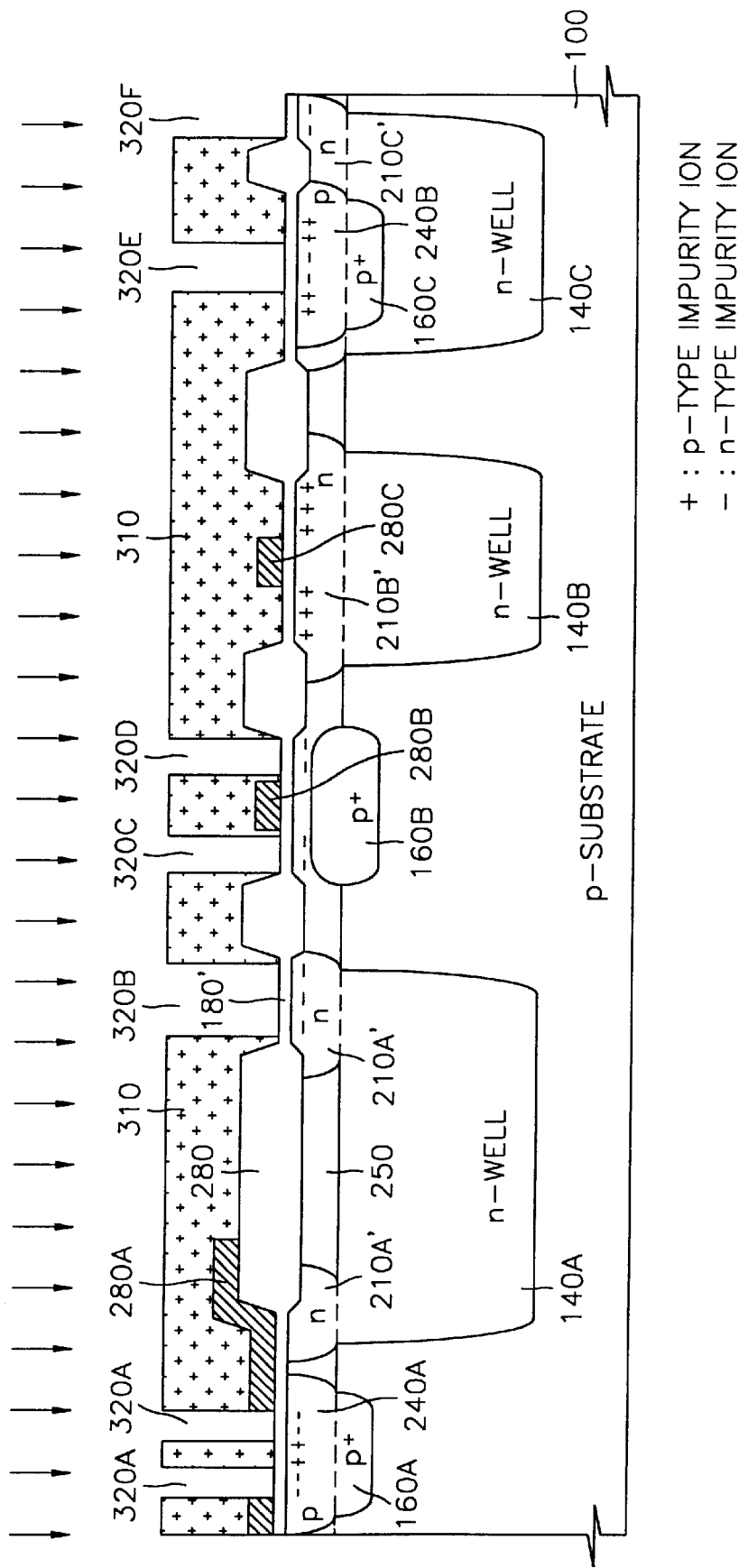

Referring to FIG. 17, a photoresist layer is coated after completely removing the photoresist layer pattern 290 (FIG. 16). A photoresist layer pattern 310 is formed by exposure and development using the above-described lithography. The photoresist layer pattern 310 includes opening portions 320A and 320B exposing source and drain regions of the lateral DMOS transistor, opening portions 320C and 320D exposing source and drain regions of the NMOS transistor and opening portions 320E and 320F exposing the emitter and the collector of the npn BJT. Subsequently, n-type impurity ions are implanted using the photoresist layer pattern 310 as an ion implantation mask, doped with $3\times10^{15}$~$5\times10^{15}/cm^2$. The n-type impurity ions are generally arsenic ions.

Figure 18:
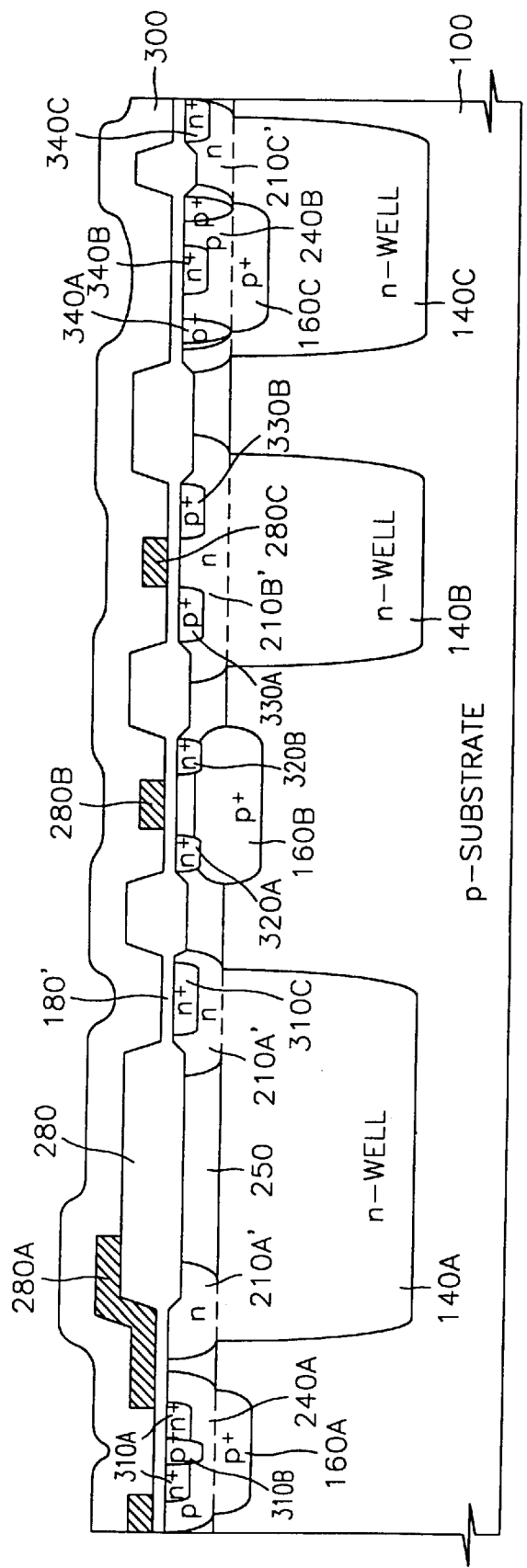

Referring to FIG. 18, the photoresist layer pattern 310 (FIG. 17) is completely removed. A low temperature oxide (LTO) is used to form an interdielectric layer 300 that insulates the conductive gate layers 280A, 280B and 280C and is deposited to be approximately 2,000 Å, and then a BPSG layer (not shown) is deposited to be approximately 7,000 Å. Here, annealing at approximately 950° C. for 30~50 min is performed to form the LTO. When the LTO is formed by the annealing, source regions 310A, a p-type highly doped region 310B and a drain region 310C of the lateral DMOS transistor, a source region 320A and a drain region 320B of the NMOS transistor, a source region 330A and a drain region 330B of the PMOS transistor, an extrinsic base region 340A, an emitter region 340B and a collector region 340C of the npn BJT are formed.

Figure 19:
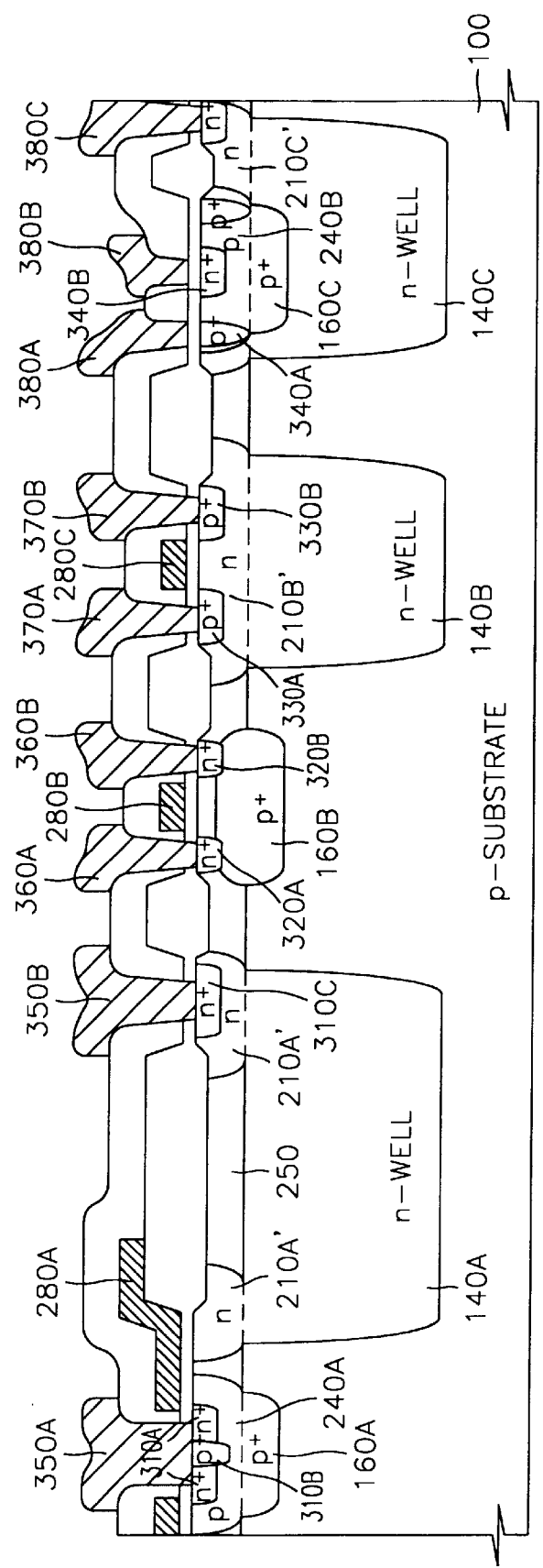

Referring to FIG. 19, a source electrode 350A and a drain electrode 350B of the lateral DMOS transistor, a source electrode 360A and a drain electrode 360B of the NMOS transistor, a source electrode 370A and a drain electrode 370B of the PMOS transistor and a base electrode 380A, an emitter electrode 380B and a collector electrode 380C of the npn BJT are formed.

It should be understood that the present invention is not limited to the illustrated embodiment and that many changes and modifications can be made within the scope of the invention by a person skilled in the art.

What is claimed is:

1. A semiconductor device including a bipolar junction transistor and a DMOS transistor formed on a semiconductor substrate of a first conductivity type, wherein the DMOS transistor comprises:
   a body region of the first conductivity type and a well region of a second conductivity type formed in a predetermined upper region of the semiconductor substrate, wherein the body region and the well region are spaced apart by a predetermined interval;
   a highly-doped bottom layer of the first conductivity type to contact the lower surface of the body region in the semiconductor substrate;
   a highly-doped source region of the second conductivity type formed in a predetermined upper region of the body region;
   a highly-doped drain region of a second conductivity type formed in a predetermined upper region of the well region;
   a gate electrode formed on a channel formation region of the body region wherein an insulating layer is interposed between the gate electrode and the body region;
   a source electrode electrically connected to the source region; and
   a drain electrode electrically connected to the drain region.

2. A semiconductor device including a bipolar junction transistor and a DMOS transistor formed on a semiconductor substrate of a first conductivity type, wherein the DMOS transistor comprises:

a body region of the first conductivity type and a well region of a second conductivity type formed in a predetermined upper region of the semiconductor substrate, wherein the body region and the well region are spaced by a predetermined interval;

a highly-doped bottom layer of the first conductivity type to contact the lower surface of the body region in the semiconductor substrate;

a highly-doped source region of the second conductivity type formed in a predetermined upper region of the body region;

a highly-doped drain region of a second conductivity type formed in a predetermined upper region of the well region;

a gate electrode formed on a channel formation region of the body region wherein an insulating layer is interposed between the gate electrode and the body region;

a source electrode electrically connected to the source region;

a drain electrode electrically connected to the drain region; and further comprising a top region of the first conductivity type formed in an upper portion of the well region.

3. A semiconductor device including a bipolar junction transistor and a DMOS transistor formed on a semiconductor substrate of a first conductivity type, wherein the DMOS transistor comprises:

a body region of the first conductivity type and a well region of a second conductivity type formed in a predetermined upper region of the semiconductor substrate, wherein the body region and the well region are spaced by a predetermined interval;

a highly-doped bottom layer of the first conductivity type to contact the lower surface of the body region in the semiconductor substrate;

a highly-doped source region of the second conductivity type formed in a predetermined upper region of the body region;

a highly-doped drain region of a second conductivity type formed in a predetermined upper region of the well region;

a gate electrode formed on a channel formation region of the body region wherein an insulating layer is interposed between the gate electrode and the body region;

a source electrode electrically connected to the source region;

a drain electrode electrically connected to the drain region; and;

wherein the bipolar junction transistor comprises:

a well region of the first conductivity type formed in a predetermined upper portion of the semiconductor substrate;

a highly-doped bottom layer of the first conductivity type formed in a predetermined region of the well region;

a first base region of the first conductivity type contacting the upper surface of the bottom layer in the well region;

a highly-doped second base region of the first conductivity type contacting the upper portion of the bottom layer in the first base region;

a highly-doped emitter region of the second conductivity type formed in a part of the surface of the first base region; and a base electrode, an emitter electrode and a collector electrode electrically connected to the second base region, the emitter region and the collector region.

4. A semiconductor device including a MOS transistor and a DMOS transistor formed on a substrate of a first conductivity type, wherein the DMOS transistor comprises:

a body region of the first conductivity type and a well region of a second conductivity type formed in a predetermined upper region of the semiconductor substrate, spaced by a predetermined interval;

a highly-doped bottom layer of the first conductivity type to contact a lower surface of the body region in the semiconductor substrate;

a highly-doped source region of the second conductivity type formed in a predetermined upper region of the body region;

a highly-doped drain region of the second conductivity type formed in a predetermined upper portion of the well region;

a gate electrode formed on a channel formation region of the body region wherein an insulating layer is interposed between the gate electrode and the body region;

a source electrode to be electrically connected to the source region;

a drain electrode to be electrically connected to the drain region.

5. A semiconductor device including a bipolar junction transistor and a DMOS transistor formed on a semiconductor substrate of a first conductivity type, wherein the DMOS transistor comprises:

a body region of the first conductivity type and a well region of a second conductivity type formed in a predetermined upper region of the semiconductor substrate, wherein the body region and the well region are spaced by a predetermined interval;

a highly-doped bottom layer of the first conductivity type to contact the lower surface of the body region in the semiconductor substrate;

a highly-doped source region of the second conductivity type formed in a predetermined upper region of the body region;

a highly-doped drain region of a second conductivity type formed in a predetermined upper region of the well region;

a gate electrode formed on a channel formation region of the body region wherein an insulating layer is interposed between the gate electrode and the body region;

a source electrode electrically connected to the source region;

a drain electrode electrically connected to the drain region; and;

wherein the MOS transistor comprises:

a highly-doped bottom layer of a first conductivity type formed in a predetermined upper region of the semiconductor substrate;

highly-doped source and drain regions of a second conductivity type contacting the upper portion of the bottom layer and spaced apart by a predetermined interval;

a gate electrode insulated to a channel formation region between the source region and the drain region by an insulting layer; and source and drain electrodes electrically connected to the source region and the drain region.

* * * * *